United States Patent
Ikemoto et al.

(10) Patent No.: US 10,164,310 B2
(45) Date of Patent: Dec. 25, 2018

(54) HIGH-FREQUENCY TRANSMISSION LINE

(71) Applicant: Murata Manufacturing Co., Ltd., Nagaokakyo-shi, Kyoto-fu (JP)

(72) Inventors: Nobuo Ikemoto, Nagaokakyo (JP); Takahiro Baba, Nagaokakyo (JP); Fumie Matsuda, Nagaokakyo (JP); Wataru Tamura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 6 days.

(21) Appl. No.: 14/751,183

(22) Filed: Jun. 26, 2015

(65) Prior Publication Data
US 2015/0295296 A1 Oct. 15, 2015

Related U.S. Application Data

(63) Continuation of application No. PCT/JP2014/061130, filed on Apr. 21, 2014.

(30) Foreign Application Priority Data

Apr. 30, 2013 (JP) .................................. 2013-094942

(51) Int. Cl.
*H01P 3/00* (2006.01)
*H05K 1/02* (2006.01)
(Continued)

(52) U.S. Cl.
CPC ................ *H01P 3/003* (2013.01); *H01P 3/08* (2013.01); *H01P 3/085* (2013.01);
(Continued)

(58) Field of Classification Search
CPC . H01P 3/003; H01P 3/08; H01P 3/085; H01Q 21/0075
(Continued)

(56) References Cited

U.S. PATENT DOCUMENTS 6,590,466 B2 * 7/2003 Lin ...................... H05K 1/0224
333/1
7,397,320 B1 * 7/2008 Bokhari .................. H01P 3/081
333/1
(Continued)

FOREIGN PATENT DOCUMENTS

| JP | 04-144301 A | 5/1992 | |
| JP | 2007-123740 A | 5/2007 | |
| JP | WO 2011007660 A1 * | 1/2011 | ............. H01P 3/081 |
| WO | 2012/074100 A1 | 6/2012 | |

OTHER PUBLICATIONS

Official Communication issued in International Patent Application No. PCT/JP2014/061130, dated Jul. 22, 2014.

*Primary Examiner* — Stephen E. Jones
(74) *Attorney, Agent, or Firm* — Keating & Bennett, LLP

(57) ABSTRACT

A first signal line is closer to a second ground conductor than a second signal line and, hence, crosstalk between the first and second signal lines is unlikely to be generated. By providing first opening portions in the second ground conductor, capacitive coupling between the first and second signal lines is reduced. Hence, in a transmission line including the first signal line, an increase in the capacitance due to the increased width of the first signal line is cancelled out by a decrease in the capacitance due to the increased distance from the first ground conductor and the first opening portions. Further, the width of the high-frequency transmission line need not be large. Further, since the capacitance is reduced by the first and second opening portions, the distances between the first ground conductor and the first and second signal lines are shortened.

17 Claims, 19 Drawing Sheets

(51) Int. Cl.
*H01Q 21/00* (2006.01)
*H01P 3/08* (2006.01)
*H01Q 21/30* (2006.01)
*H05K 1/14* (2006.01)

(52) U.S. Cl.
CPC ......... *H01Q 21/0075* (2013.01); *H01Q 21/30* (2013.01); *H05K 1/0216* (2013.01); *H05K 1/0237* (2013.01); *H05K 1/0253* (2013.01); *H05K 1/0219* (2013.01); *H05K 1/0225* (2013.01); *H05K 1/0228* (2013.01); *H05K 1/147* (2013.01); *H05K 2201/09618* (2013.01); *H05K 2201/09727* (2013.01)

(58) Field of Classification Search
USPC ........................................................ 333/238
See application file for complete search history.

(56) References Cited

U.S. PATENT DOCUMENTS

| | | | |
|---|---|---|---|
| 2002/0084876 A1* | 7/2002 | Wright | H01P 3/081 333/238 |
| 2010/0033263 A1* | 2/2010 | Baik | B82Y 10/00 333/100 |
| 2010/0225424 A1* | 9/2010 | Yeates | H01P 3/08 333/238 |
| 2011/0116423 A1* | 5/2011 | Rousu | H01Q 1/242 370/297 |
| 2012/0097433 A1* | 4/2012 | Kato | H01P 3/081 174/254 |
| 2013/0127560 A1 | 5/2013 | Kato et al. | |

* cited by examiner

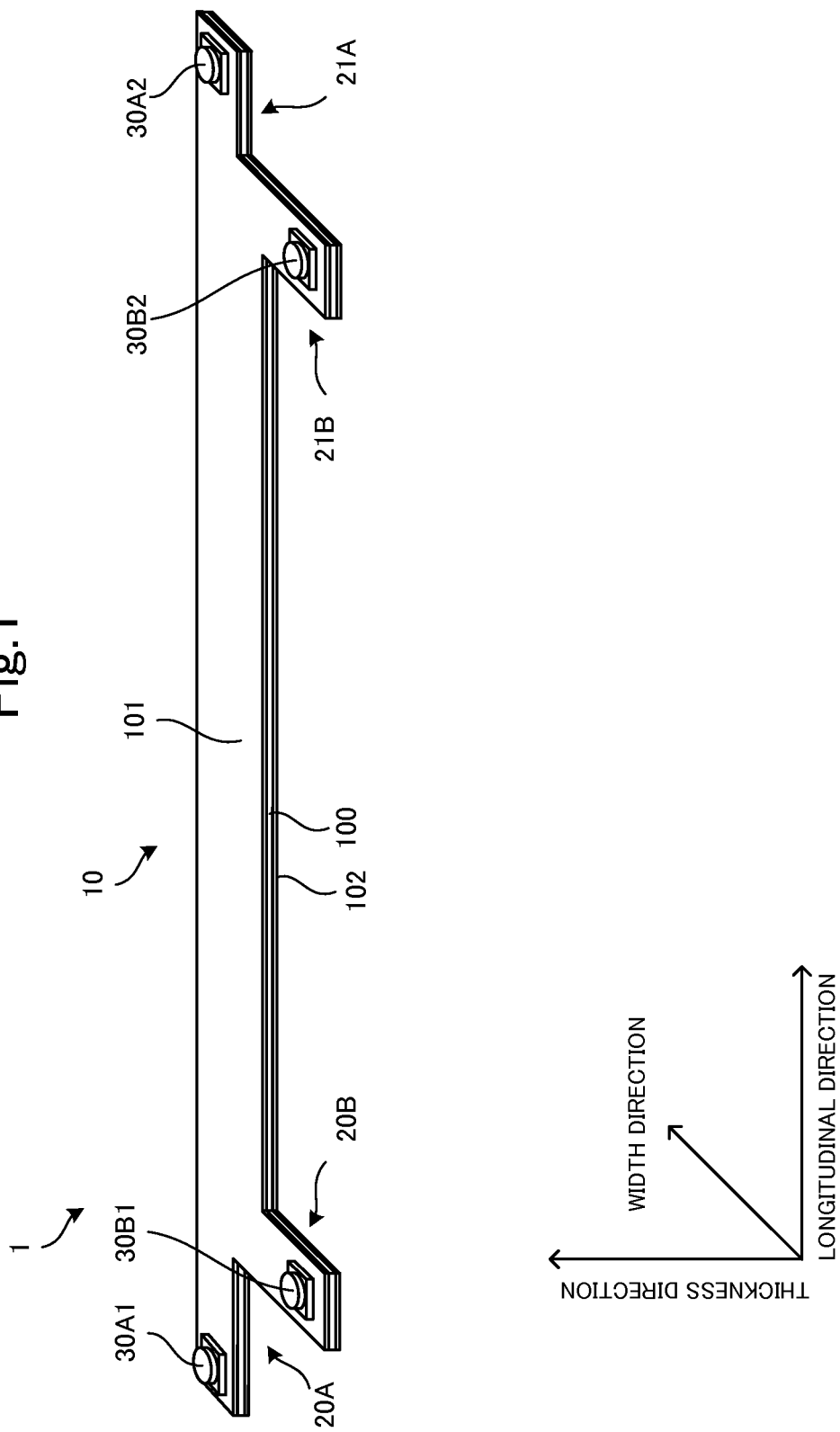

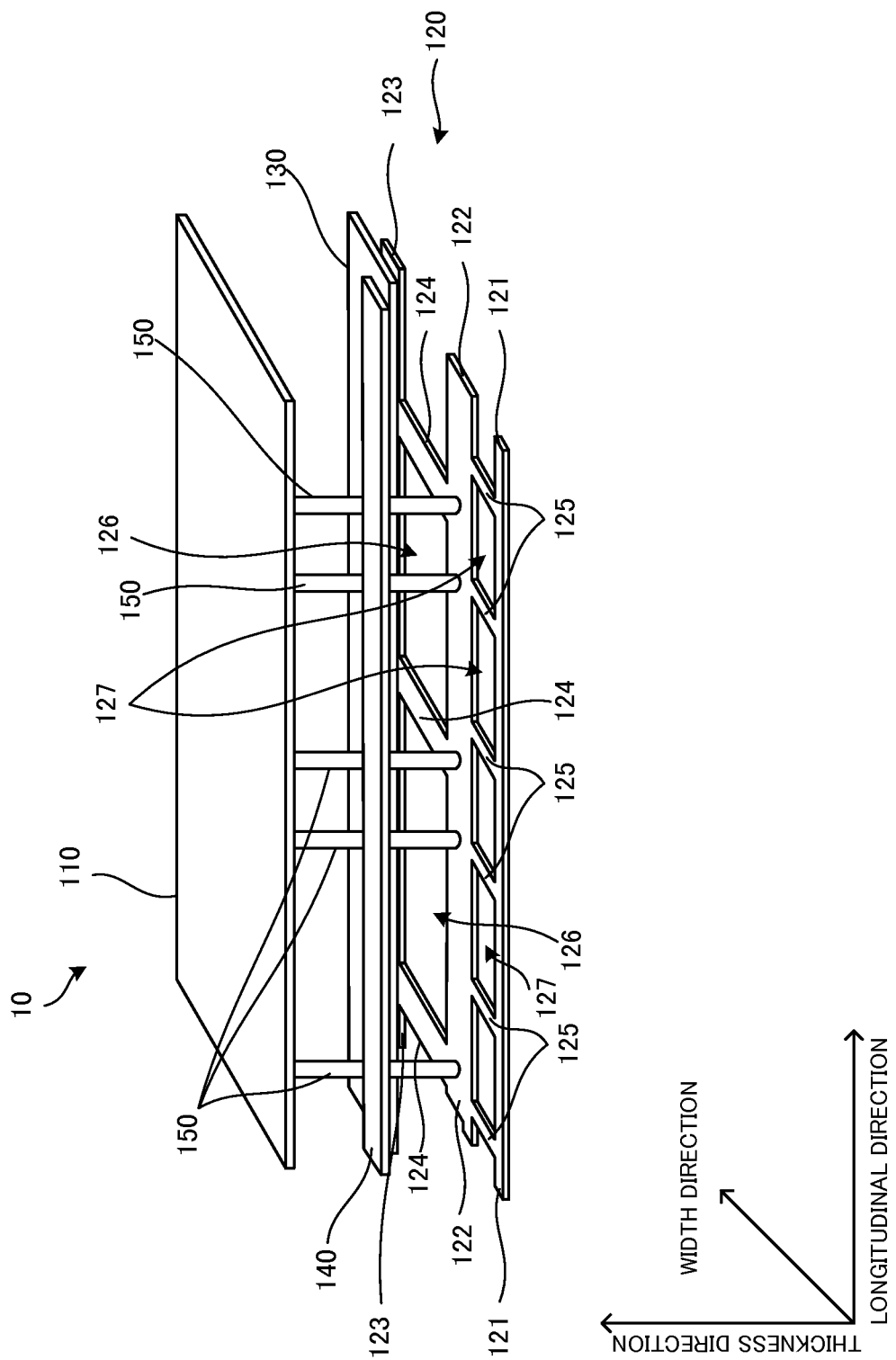

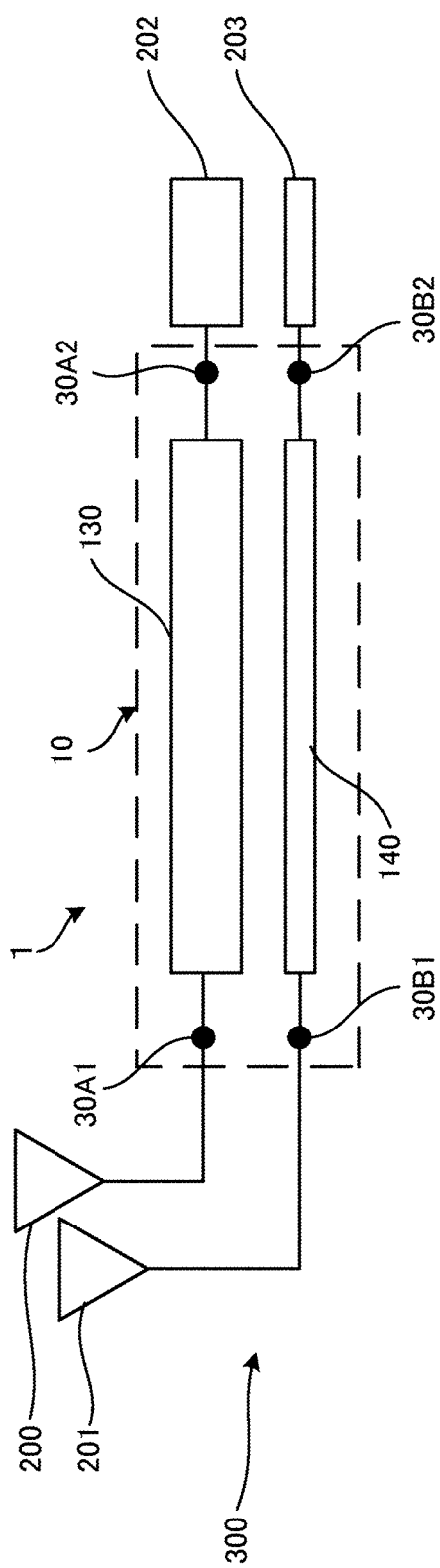

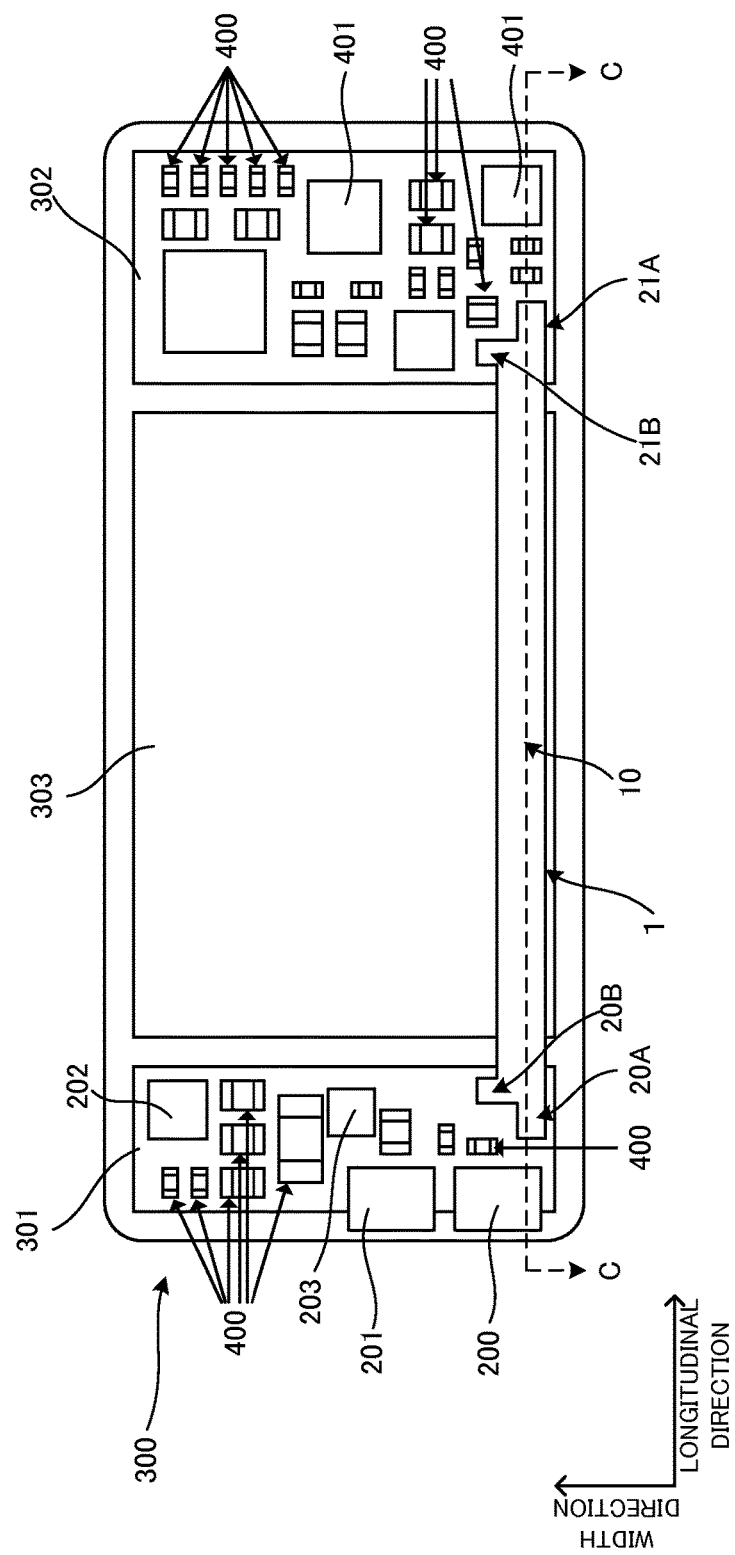

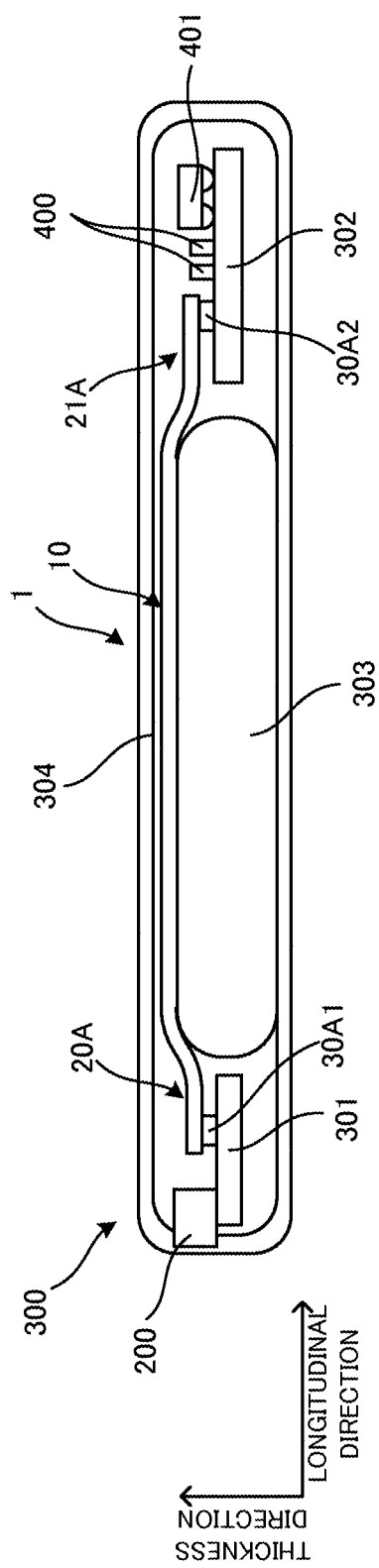

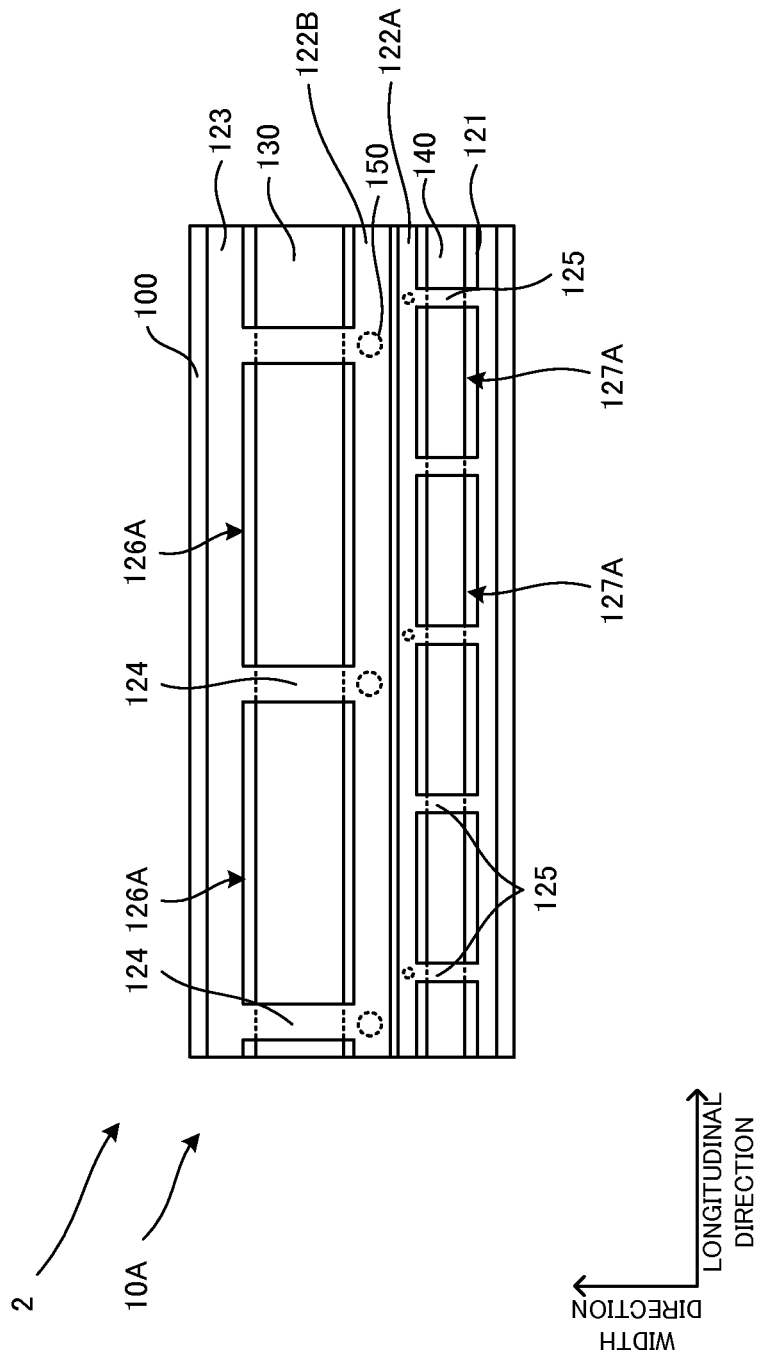

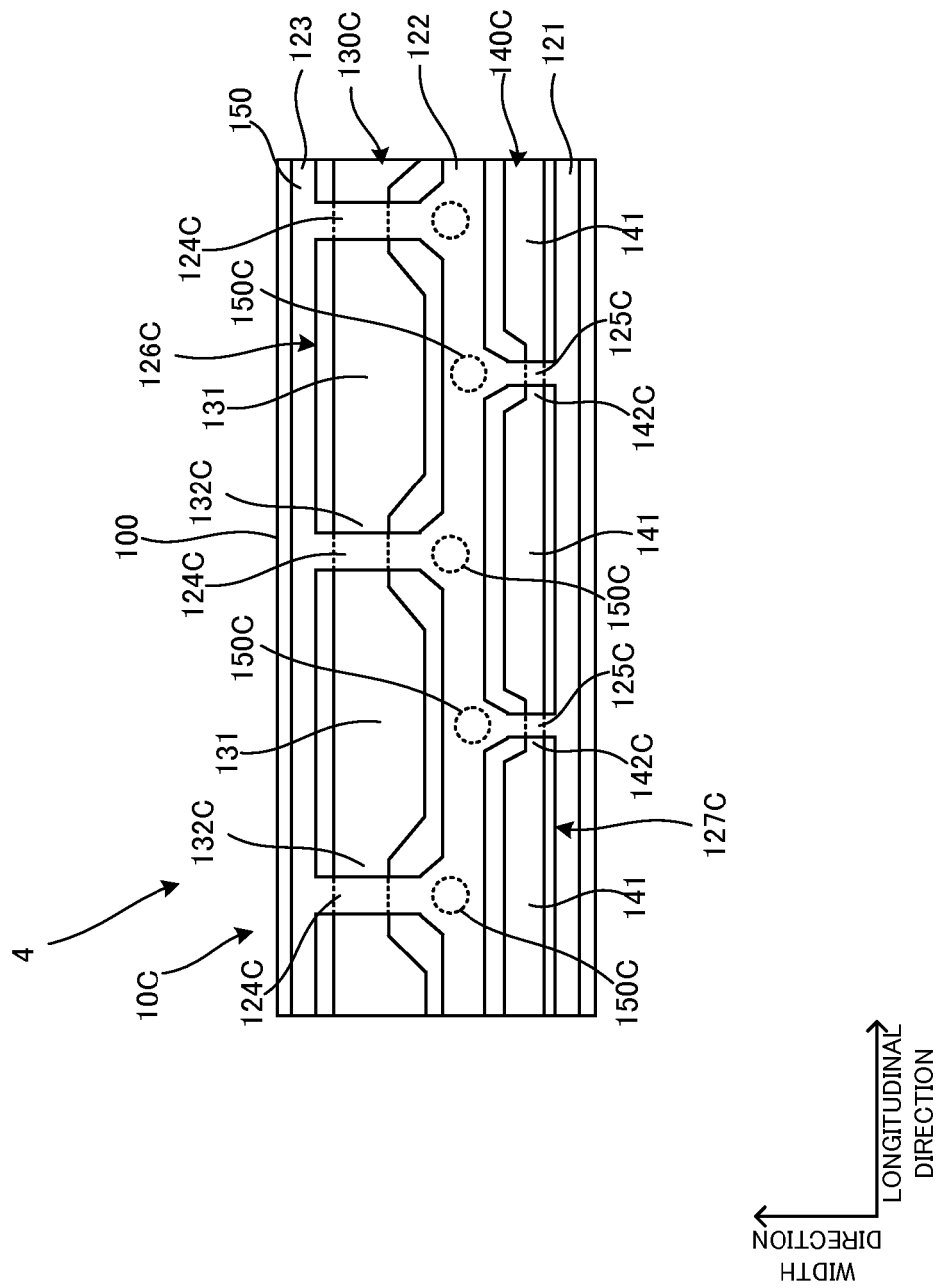

Fig.10A
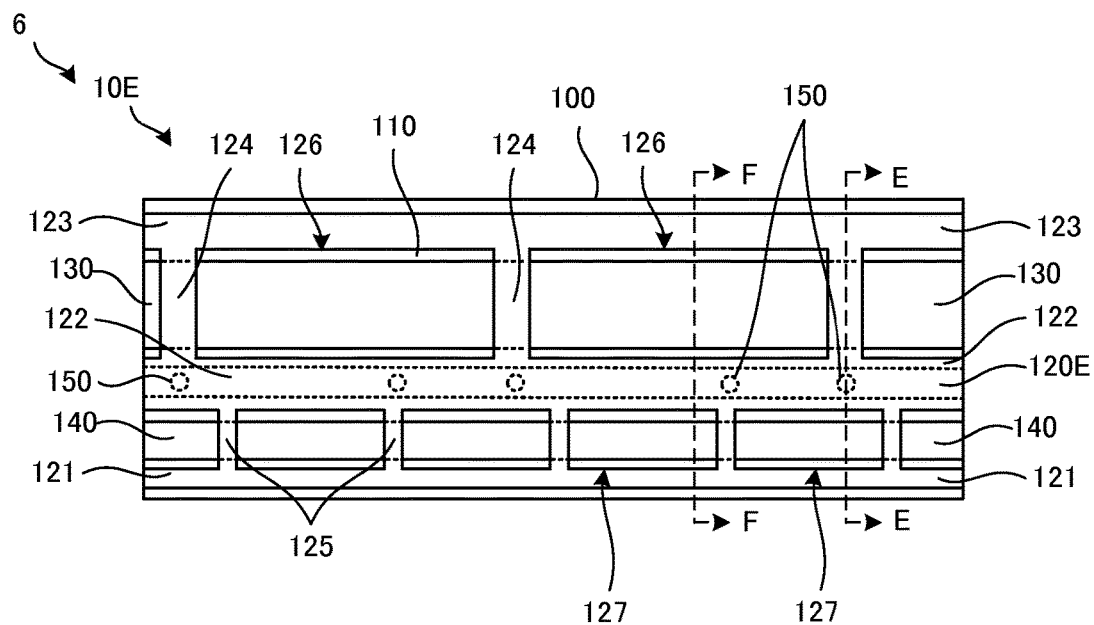
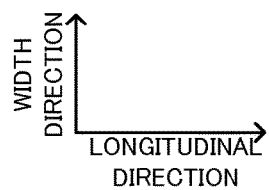

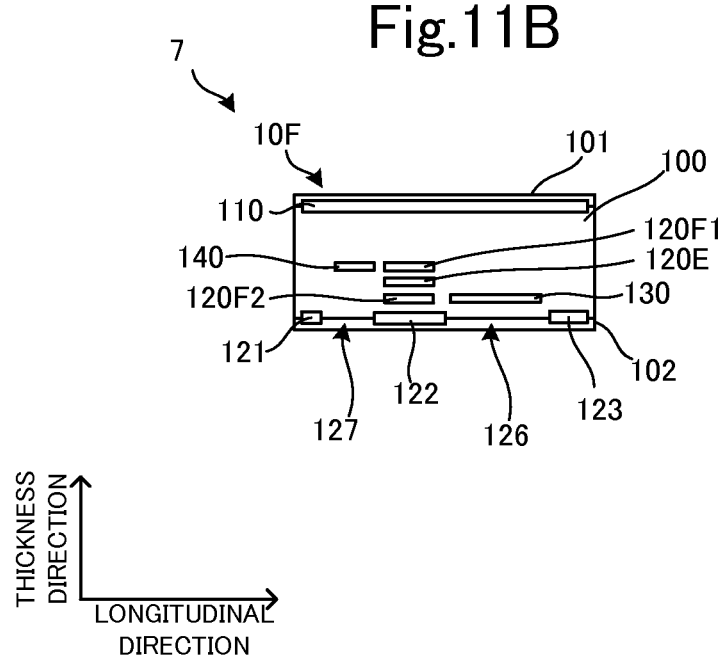

HIGH-FREQUENCY TRANSMISSION LINE

BACKGROUND OF THE INVENTION

1. Field of the Invention

The present invention relates to a high-frequency transmission line such as a thin flat cable configured to transmit high-frequency signals.

2. Description of the Related Art

To date, for example, thin flat cables for transmitting high-frequency signals in a GHz band have been used in electronic apparatuses. A flat cable is a high-frequency transmission line substantially having, for example, a tri-plate shape, in which ground conductors are arranged on the front surface and back surface of a long dielectric base body and signal lines are arranged within the dielectric base body.

At present, electronic apparatuses perform, for example, GPS communication, wireless LAN communication, and Bluetooth (registered trademark) communication and, hence, handle many high-frequency signals (for example, about 700 MHz or higher). As a result, the flexible substrate (flat cable) disclosed in Japanese Unexamined Patent Application Publication No. 2007-123740 transmits a plurality of high-frequency signals.

The flexible substrate disclosed in Japanese Unexamined Patent Application Publication No. 2007-123740 includes two signal lines separated from each other to suppress crosstalk between the two signal lines.

In some cases, a plurality of high-frequency signals transmitted through a single flat cable have considerably different strengths. For example, the strength of a high-frequency GPS signal is significantly lower than that of a high-frequency signal in wireless LAN communication. Accordingly, in transmission of a signal with such a low strength, it is desirable that the insertion loss of a signal line be made to be sufficiently low.

When the width of a signal line for a GPS signal is increased to reduce the insertion loss of the signal line, the distance between two signal lines is decreased, whereby crosstalk between the two signal lines is generated. On the other hand, when the distance between the two signal lines is maintained constant to suppress the crosstalk, the width of the whole flat cable needs to be increased by an amount corresponding to an increase in the width of the signal line for a GPS signal. Further, when the width of the signal line for a GPS signal is increased, coupling with a ground conductor is likely to be generated, whereby the capacitance of a transmission line formed of the signal line and the ground conductor increases and the characteristic impedance of the transmission line decreases.

Even when the thickness of the signal line is increased instead of increasing the width of the signal line to reduce the insertion loss, the capacitance increases. In other words, the characteristic impedance decreases when the thickness of the signal line is increased. To increase the characteristic impedance, which has decreased, the ground conductor on the front or back surface needs to be spaced apart from the signal line, whereby the thickness of the whole flat cable needs to be increased.

SUMMARY OF THE INVENTION

Preferred embodiments of the present invention provide a narrow and thin high-frequency transmission line that realizes low-loss transmission of high-frequency signals while providing a plurality of high-frequency signal lines that respectively transmit a plurality of high-frequency signals having different signal strengths.

A high-frequency transmission line according to a preferred embodiment of the present invention includes a multilayer base body including a plurality of base materials stacked on top of one another; a first ground conductor arranged on one main surface side of the multilayer base body; a second ground conductor arranged on another main surface side of the multilayer base body; a first signal line that is arranged within the multilayer base body and sandwiched between the first ground conductor and the second ground conductor and spaced apart from the first ground conductor by a first distance and that has a first line width; and a second signal line that is arranged within the multilayer base body and sandwiched between the first ground conductor and the second ground conductor and spaced apart from the first ground conductor by a second distance and that has a second line width.

In the high-frequency transmission line according to a preferred embodiment of the present invention, the first line width is larger than the second line width; the first distance is longer than the second distance; and the second ground conductor includes a plurality of first opening portions arranged along the first signal line and a plurality of second opening portions arranged along the second signal line.

A flat cable according to another preferred embodiment of the present invention preferably includes the multilayer base body, and includes the first ground conductor, for example, on the upper surface side (one main surface side) and the second ground conductor on the lower surface side (the other main surface side).

The first signal line is arranged closer to the second ground conductor than the second signal line. In other words, the first signal line is spaced apart from the second signal line and, hence, crosstalk between the first and second signal lines becomes unlikely to be generated even when the width of the first signal line is increased.

The width of the first signal line is larger than the width of the second signal line and, hence, if the first signal line and the second signal line are spaced apart from the first ground conductor by the same distance, the capacitive coupling between the first ground conductor and the first signal line is increased more than the capacitive coupling between the first ground conductor and the second signal line. As a result, the characteristic impedance of a transmission line including the first signal line becomes lower than the characteristic impedance of a transmission line including the second signal line.

However, when the first signal line is more spaced apart from the first ground conductor than the second signal line, the capacitive coupling between the first signal line and the first ground conductor is reduced, such that the characteristic impedance is closer to a desired value. However, since the first signal line becomes closer to the second ground conductor, capacitive coupling between the first signal line and the second ground conductor is increased.

Hence, in high-frequency transmission lines according to various preferred embodiments of the present invention, the capacitive coupling between the first signal line and the second ground conductor is reduced by providing the plurality of first opening portions in the second ground conductor.

As described above, in the transmission line including the first signal line, an increase in the capacitance due to the increased width of the first signal line is cancelled out by a decrease in the capacitance due to the increased distance between the first ground conductor and the first signal line, and due to the provision of the plurality of first opening portions. As a result, the transmission line including the first signal line transmits a high-frequency signal having a low signal strength with a low loss.

Further, in a high-frequency transmission line according to a preferred embodiment of the present invention, the width of the whole transmission line need not be increased and the insertion loss of the first signal line is reduced.

Further, since the capacitance of the transmission lines respectively including the first signal line and the second signal line is reduced due to the first opening portions and the second opening portions, the distances between the transmission lines and the first ground conductor is shortened compared with the case in which the second ground conductor does not include the opening portions. As a result, the thickness of the whole transmission line is significantly reduced in the high-frequency transmission line according to a preferred embodiment of the present invention.

Further, a high-frequency transmission line according to a preferred embodiment of the present invention, including the plurality of first opening portions and the plurality of second opening portions on the bottom surface side (second ground conductor side), becomes softer on the bottom surface side compared with the top surface side, and is easy to bend.

A width in the width direction of each of the plurality of first opening portions corresponding to each of the first signal line preferably is larger than a width of the plurality of second opening portions corresponding to the second signal line.

Even when the line width of the first signal line is increased in accordance with an increase in the width of the first opening portions which has been made larger than the width of the second opening portions, the capacitive coupling between the first signal line and the second ground conductor remains the same. As a result, the insertion loss of the first signal line is further reduced.

A configuration may be used in which the first ground conductor and the second ground conductor are electrically connected to each other through an interlayer connection conductor, and the interlayer connection conductor is provided in a region sandwiched between the first signal line and the second signal line when the multilayer base body is viewed in plan.

The interlayer connection conductor prevents generation of crosstalk between the first signal line and the second signal line.

The plurality of base materials may be flexible resin sheets.

The flexible resin sheets are made of, for example, a polyimide or a liquid crystal polymer. As a result, the high-frequency transmission line becomes easier to bend, enabling easier routing of the wiring.

The first signal line and the second signal line may be arranged closer to the second ground conductor than to the first ground conductor.

Even when the line widths of the first signal line and the second signal line are increased in accordance with the distances by which the first signal line and the second signal line are spaced apart from the first ground conductor, the capacitive coupling between the first signal line and the first ground conductor and the capacitive coupling between the second signal line and the first ground conductor are reduced. As a result, the insertion losses of the first signal line and the second signal line are further reduced.

A signal strength of a high-frequency signal flowing through the first signal line may be lower than a signal strength of a high-frequency signal flowing through the second signal line.

The first signal line is able to be connected to an antenna for GPS communication and the second signal line is able to be connected to an antenna for a wireless local area network or for Bluetooth (registered trademark) communication.

The first signal line, whose insertion loss is lower than that of the second signal line, is configured to transmit, for example, a high-frequency GPS communication signal with a low signal strength.

According to various preferred embodiments of the present invention, a narrow and thin high-frequency transmission line is provided and has a configuration including a plurality of high-frequency signal lines that respectively transmit a plurality of high-frequency signals having different signal strengths and which enables low-loss transmission of the high-frequency signals.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is an external perspective view of a flat cable according to a first preferred embodiment of the present invention.

FIG. 2 is an exploded perspective view of the main transmission line portion of the flat cable according to the first preferred embodiment of the present invention.

FIG. 4 is a portion of a wiring diagram of an electronic apparatus with wiring that includes the flat cable according to the first preferred embodiment of the present invention.

FIG. 5A is a cross-sectional plan view of the electronic apparatus in which the internal wiring includes the flat cable, and FIG. 5B is a cross-sectional view taken along line C-C.

FIG. 6 is a bottom view of a flat cable according to a second preferred embodiment of the present invention.

FIG. 8 is a bottom view of a flat cable according to a fourth preferred embodiment of the present invention.

FIG. 10A is a bottom view of the main transmission line portion of a flat cable according to a sixth preferred embodiment of the present invention.

FIG. 11A and FIG. 11B are cross-sectional views of the main transmission line portion of a flat cable according to a seventh preferred embodiment of the present invention.

DETAILED DESCRIPTION OF THE PREFERRED EMBODIMENTS

Figure 3A:
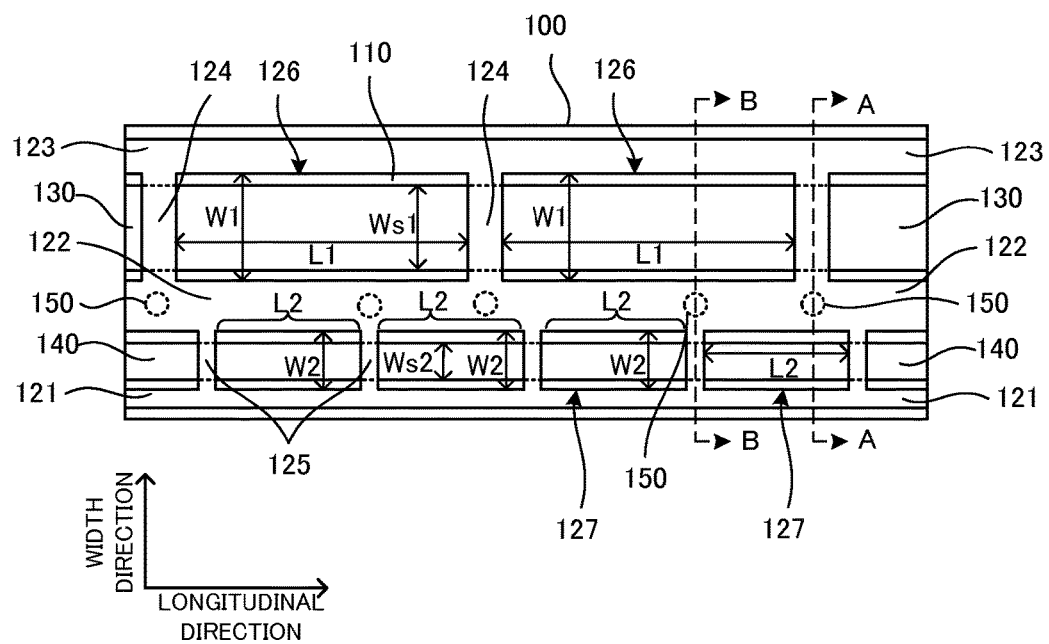
FIG. 3A is a bottom view of the flat cable according to the first preferred embodiment of the present invention.

A flat cable 1 which is a high-frequency transmission line according to a first preferred embodiment of the present invention will be described with reference to FIG. 1 to FIG. 4.

FIG. 1 is an external perspective view of the flat cable 1. In FIG. 1, it is assumed that one end surface of the flat cable 1 facing in the thickness direction is an upper main surface (one main surface) and the other end surface facing in a direction opposite the thickness direction is a lower main surface (the other main surface).

Referring to FIG. 1, the flat cable 1 is long in the left-right direction in the plane of the figure. The direction in which the flat cable 1 is long is called a longitudinal direction. The flat cable 1 preferably includes a lead-out transmission line portion 20A, a lead-out transmission line portion 20B, a main transmission line portion 10, a lead-out transmission line portion 21A, and a lead-out transmission line portion 21B. The lead-out transmission line portion 20A and the lead-out transmission line portion 20B are arranged on one end portion of the main transmission line portion 10 in the longitudinal direction. The lead-out transmission line portion 21A and the lead-out transmission line portion 21B are arranged on the other end portion of the main transmission line portion 10.

The main transmission line portion 10 substantially has a shape which is long in the longitudinal direction of the flat cable 1. The main transmission line portion 10 preferably includes a resist layer 102, an auxiliary ground conductor 120, a dielectric base body 100, a reference ground conductor 110, and a resist layer 101 stacked in this order in the thickness direction. In other words, the reference ground conductor 110 and the auxiliary ground conductor 120 are respectively covered and protected by the resist layer 101 and the resist layer 102.

The reference ground conductor 110 is a ground conductor which becomes a reference in the design of the characteristic impedance of the transmission line of the flat cable 1. When the characteristic impedance of the transmission line of the flat cable 1 is set to a predetermined value (for example, about 50 ohm), the dimensions and the arrangement of the reference ground conductor 110 are designed such that the characteristic impedance corresponding to the case where the reference ground conductor 110 alone is provided becomes a little higher than a desired value. The auxiliary ground conductor 120 is a ground conductor that is preferably used for the final adjustment of the characteristic impedance of the transmission line of the flat cable 1. More specifically, the dimensions and arrangement of the auxiliary ground conductor 120 are preferably designed such that the characteristic impedance, which has been set to a little higher value by using the reference ground conductor 110, is adjusted to a desired value (for example, about 50 ohm). The dielectric base body 100 is formed preferably by stacking a plurality of resin sheets made of a flexible insulating material (for example, a thermoplastic resin such as a polyimide or a liquid crystal polymer) on top of one another. The reference ground conductor 110 and the auxiliary ground conductor 120 are made of a conductive material (for example, a metallic foil made of copper (Cu)). Note that it is not needed that the reference ground conductor 110 and the auxiliary ground conductor 120 be respectively arranged on the upper surface and lower surface of the dielectric base body 100, and at least one of them may be housed inside the dielectric base body 100.

The lead-out transmission line portion 20A, the lead-out transmission line portion 20B, the lead-out transmission line portion 21A, and the lead-out transmission line portion 21B each include the reference ground conductor 110 on the upper surface and the auxiliary ground conductor 120 on the lower surface, similarly to the main transmission line portion 10. Also in the lead-out transmission line portion 20A, the lead-out transmission line portion 20B, the lead-out transmission line portion 21A, and the lead-out transmission line portion 21B, the dielectric base body 100 is sandwiched between the reference ground conductor 110 and the auxiliary ground conductor 120.

A connector 30A1 is arranged on the upper surface of the lead-out transmission line portion 20A, and a connector 30B1 is arranged on the upper surface of the lead-out transmission line portion 20B. A connector 30A2 is arranged on the upper surface of the lead-out transmission line portion 21A and a connector 30B2 is arranged on the upper surface of the lead-out transmission line portion 21B. Each of the connector 30A1, the connector 30A2, the connector 30B1, and the connector 30B2 is a coaxial connector.

The conductor portions of the connector 30A1 and the connector 30A2 are electrically connected to a signal line 130 and to the reference ground conductor 110 and the auxiliary ground conductor 120 (refer to FIG. 2) through internal wiring lines (not illustrated). The conductor portions of the connector 30B1 and the connector 30B2 are electrically connected to a signal line 140 and to the reference ground conductor 110 and the auxiliary ground conductor 120 (refer to FIG. 2) through internal wiring lines (not illustrated).

Figure 3B:
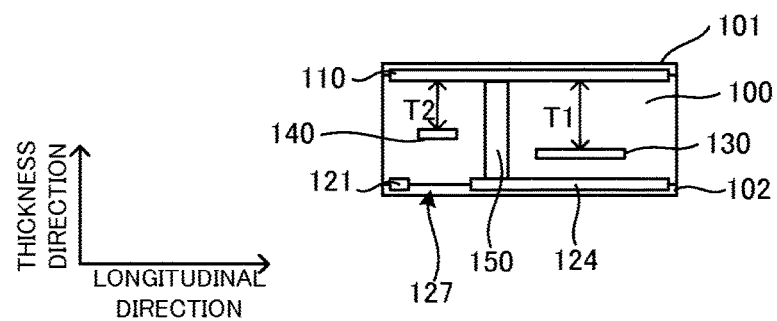
FIG. 3B is a cross-sectional view taken along line A-A.
Figure 3C:
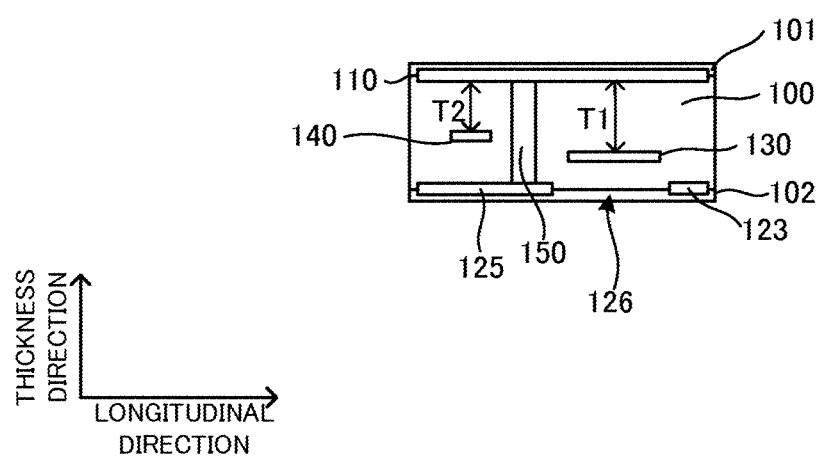
FIG. 3C is a cross-sectional view taken along line B-B.

FIG. 2 is an exploded perspective view of the main transmission line portion 10 of the flat cable 1 according to the first preferred embodiment of the present invention. FIG. 3A is a bottom view of the main transmission line portion 10. FIG. 3B is a cross-sectional view of the main transmission line portion 10 taken along line A-A. FIG. 3C is a cross-sectional view of the main transmission line portion 10 taken along line B-B. In FIG. 2, the dielectric base body 100 and the resist layers 101 and 102 are not illustrated. In FIG. 3A, the resist layers 101 and 102 are not illustrated.

Referring to FIG. 2, the auxiliary ground conductor 120 preferably includes a long conductor 121, a long conductor 122, a long conductor 123, a plurality of bridge conductors 124, and a plurality of bridge conductors 125.

Each of the long conductor 121, the long conductor 122, and the long conductor 123 is substantially shaped like a flat plate which is long in the longitudinal direction. The long conductor 121, the long conductor 122, and the long conductor 123 are arranged in this order in the width direction. Each of the plurality of bridge conductors 124 and the plurality of bridge conductors 125 is substantially shaped like a flat plate which is long in the width direction.

The plurality of bridge conductors 124 are arranged in the longitudinal direction at predetermined intervals such that the plurality of bridge conductors 124, the long conductor 122, and the long conductor 123 substantially form the shape of a ladder. Each of a plurality of opening portions 126 is formed as a result of being surrounded by the long conductor 122, the long conductor 123, and two bridge conductors 124.

The plurality of bridge conductors 125 are arranged in the longitudinal direction at predetermined intervals such that the plurality of bridge conductors 125, the long conductor 121, and the long conductor 122 substantially form the shape of a ladder. Each of a plurality of opening portions 127 is formed as a result of being surrounded by the long conductor 121, the long conductor 122, and two bridge conductors 125.

The dielectric base body 100 includes therein the signal line 130, the signal line 140, and a plurality of interlayer connection conductors 150, as illustrated in FIG. 2, FIG. 3B, and FIG. 3C.

Each of the signal line 130 and the signal line 140 is substantially shaped like a flat layer which is long in the longitudinal direction. The signal line 130 and the signal line 140 are made of a conductive material (for example, a metallic foil made of copper (Cu)).

As illustrated in FIG. 3A, a line width Ws1 of the signal line 130 is larger than a line width Ws2 of the signal line 140. As a result of this shape, the signal line 130 has a lower DC resistance than the signal line 140. As illustrated in FIG. 3A, the signal line 130 and the signal line 140 are spaced apart from each other with the long conductor 122 therebetween when the flat cable 1 is viewed in plan. As illustrated in FIG. 3B and FIG. 3C, the signal line 130 and the signal line 140 are arranged at respective positions which are different from each other in the thickness direction. Specifically, the signal line 130 is spaced apart from the reference ground conductor 110 by a distance T1, and the signal line 140 is spaced apart from the reference ground conductor 110 by a distance T2 (here, the distance T1>the distance T2). By arranging the signal line 130 and the signal line 140 respectively at different positions in the thickness direction, the distance between the signal line 130 and the signal line 140 is further increased.

With this arrangement, generation of crosstalk in the flat cable 1 is significantly reduced or prevented by increasing the distance between the signal line 130 and the signal line 140 without increasing the width of the whole flat cable 1.

The signal line 130 and the signal line 140 are arranged closer to the auxiliary ground conductor 120 side than to the reference ground conductor 110 side. In other words, the distance T1 and the distance T2 are larger than half the distance between the reference ground conductor 110 and the auxiliary ground conductor 120.

As illustrated in FIG. 3A, the plurality of opening portions 126 are arranged along the signal line 130. The plurality of opening portions 127 are arranged along the signal line 140.

A width W1 of each opening portion 126 is larger than the line width Ws1 of the signal line 130. A width W2 of each opening portion 127 is larger than the line width Ws2 of the signal line 140.

The opening portions 126 are larger than the opening portions 127. Specifically, the width W1 is larger than the width W2. A length L1 is larger than a length L2. The length L1 (for example, several millimeters to several centimeters) is less than about ½ of the wavelength of a high-frequency signal flowing through the signal line 130, and preferably less than about ¼ of the wavelength, for example. The length L2 is also less than about ½ of the wavelength of a high-frequency signal flowing through the signal line 140, and preferably less than about ¼ of the wavelength, for example. When the length of an opening portion is larger than or equal to about ½ of the wavelength of a high-frequency signal flowing through the signal line 130 (the signal line 140), undesirable radiation of the high-frequency signal may be generated from the opening portions. However, with the sizes of the opening portions 126 (the opening portions 127) described above, such undesirable radiation of the high-frequency signal flowing through the signal line 130 (the signal line 140) is unlikely to be generated. Note that the length L1 need not be larger than the length L2, and the length L1 and the length L2 need only be respectively less than about ½ of the corresponding high-frequency signals.

The capacitive coupling between the signal line 130 and the auxiliary ground conductor 120 changes when the size of the opening portions 126 is changed. Hence the characteristic impedance of the transmission line including the signal line 130 can be adjusted by changing the size of the opening portions 126. More specifically, the characteristic impedance of the transmission line including the signal line 130 increases when the size (the length L1 and the width W1) of the opening portions 126 is increased.

The relationship between the positions of the signal line 130 and the signal line 140 and the sizes of the opening portions 126 and the opening portions 127 will now be described.

As described above, the line width Ws1 of the signal line 130 is larger than the line width Ws2 of the signal line 140 and, hence, when the signal line 130 is arranged at the same position in the thickness direction as the signal line 140, the strength of the capacitive coupling between the signal line 130 and the reference ground conductor 110 is increased more than that between the signal line 140 and the reference ground conductor. Hence, in the case where the transmission line including the signal line 140 is designed to have a characteristic impedance of, for example, about 50 ohm, the characteristic impedance of the transmission line including the signal line 130 becomes less than about 50 ohm if the signal line 130 and the signal line 140 are arranged at the same position in the thickness direction.

However, as illustrated in the first preferred embodiment of the present invention, when the distance between the reference ground conductor 110 and the signal line 130 is made to be longer than the distance between the reference ground conductor 110 and the signal line 140, the characteristic impedance of the transmission line including the signal line 130 is increased and is close to a desired value (for example, about 50 ohm). However, since the signal line 130 becomes close to the auxiliary ground conductor 120, capacitive coupling between the signal line 130 and the auxiliary ground conductor 120 is increased.

Hence, as described above, capacitive coupling between the signal line 130 and the auxiliary ground conductor 120 is reduced by providing the plurality of opening portions 126. As a result, in the signal line 130, an increase in capacitive coupling due to an increase in the line width Ws1 is cancelled out by a reduction in capacitive coupling based on the distance T1 from the reference ground conductor 110 and the shape of the plurality of opening portions 126. Hence, a desired characteristic impedance of the transmission line including the signal line 130 is also realized.

Note, in the present invention, it is not mandatory to make the width W1 of the opening portions 126 be larger than the width W2 of the opening portions 127. A configuration may be used in which the signal line 130 is simply made to be farther from the reference ground conductor 110 to cancel out the increase in the capacitive coupling of the transmission line including the signal line 130.

As described above, by using the flat cable 1 of the first preferred embodiment of the present invention, the signal line 130 and the signal line 140 having different DC resistances are able to be housed together while significantly reducing or preventing crosstalk and, further, the impedance of the transmission line including the signal line 130 and the impedance of the transmission line including the signal line 140 are able to be respectively set to desired values. At this time, the characteristic impedances are able to be set to desired values without increasing the characteristic impedances by placing the signal line 130 and the signal line 140 farther from the reference ground conductor 110 and the auxiliary ground conductor 120, i.e., without increasing the thickness of the flat cable 1. Further, the signal line 130 and the signal line 140 need not be arranged farther from each other in the width direction of the flat cable 1 to significantly reduced or prevent crosstalk generated between the signal line 130 and the signal line 140. In other words, crosstalk is able to be significantly reduced or prevented while the width of the flat cable 1 is maintained small.

Further, in the flat cable 1, the auxiliary ground conductor 120 includes the plurality of opening portions 126 and the plurality of opening portions 127, the dielectric base body 100 is made of a flexible material, and the thickness is not too large. Hence, the flat cable 1 is easily bent, enabling easy routing of wiring lines.

The interlayer connection conductors 150 are made of a conductive material including, for example, tin (Sn) or silver (Ag). The plurality of interlayer connection conductors 150 extend through the dielectric base body 100 in the thickness direction and electrically connect the reference ground conductor 110 to the auxiliary ground conductor 120. The lower ends (lower surface side) of the interlayer connection conductors 150 are connected to the auxiliary ground conductor 120 at portions where the plurality of bridge conductors 124 or the plurality of bridge conductors 125 are connected to the long conductor 122. Note that a configuration may be used in which the interlayer connection conductors 150 are connected to the long conductor 121 or the long conductor 123.

Referring to FIG. 3A to FIG. 3C, the interlayer connection conductors 150, as a result of being arranged between the signal line 130 and the signal line 140, significantly reduce or prevent generation of crosstalk between the signal line 130 and the signal line 140 and allows a stable ground potential to be obtained.

An example usage of the flat cable 1 according to the first preferred embodiment of the present invention will now be described. FIG. 4 is a portion of a wiring diagram of an electronic apparatus 300 having wiring that includes the flat cable 1 according to the first preferred embodiment of the present invention. FIG. 5A is a cross-sectional plan view of the electronic apparatus 300 in which the internal wiring includes the flat cable 1. FIG. 5B is a cross-sectional view of the electronic apparatus 300 taken along line C-C.

Referring to FIG. 4, the flat cable 1 transmits alone a GPS signal received by a GPS communication antenna 200 and a wireless LAN signal received by a wireless LAN communication antenna 201.

The GPS communication antenna 200 receives a GPS signal transmitted from a GPS satellite (not illustrated). A GPS signal received by the GPS communication antenna 200 is output to a connector 30A1 of the flat cable 1. Then the GPS signal is transmitted to a GPS signal processing circuit 202 through a transmission line including the signal line 130, the reference ground conductor 110, and the auxiliary ground conductor 120 and through a connector 30A2.

The wireless LAN communication antenna 201 transmits and receives a wireless LAN signal. A wireless LAN signal received by the wireless LAN communication antenna 201 is output to the connector 30B1 of the flat cable 1. Then, the wireless LAN signal is transmitted to a wireless LAN signal processing circuit 203 through a transmission line including the signal line 140, the reference ground conductor 110, and the auxiliary ground conductor 120 and through a connector 30B2.

The electronic apparatus 300 includes a thin apparatus casing 304. An antenna circuit substrate 301, a main circuit substrate 302, and a battery pack 303 are housed in the apparatus casing 304.

The antenna circuit substrate 301 and the main circuit substrate 302 are spaced apart from each other with the battery pack 303 therebetween. The GPS communication antenna 200 and the wireless LAN communication antenna 201 are mounted on the antenna circuit substrate 301. A GPS signal and a wireless LAN signal are transmitted to the main circuit substrate 302, through the flat cable 1, and are processed by a plurality of ICs 401 mounted on the main circuit substrate 302.

A space between the battery pack 303 and the apparatus casing 304 is very small, depending on the apparatus. In that case, a general coaxial cable cannot extend through the space. However, the flat cable 1, which is thin, is able to extend through the space.

A GPS signal and a wireless LAN signal are high-frequency signals having a frequency exceeding about 1 GHz, for example. The strength of a GPS signal is extremely low compared with the strength of a wireless LAN signal. However, in the signal line 130, which has the configuration described above, the insertion loss of the signal line 130 is lower than the insertion loss of the signal line 140 and, hence, the signal line 130 can transmit even a GPS signal having a low signal strength to the GPS signal processing circuit 202.

However, not limited to the combination of a GPS signal and a wireless LAN signal, the flat cable 1 is configured to transmit two high-frequency signals (for example, signals of about 700 MHz or higher) having different strengths. For example, the wireless LAN signal may be a short-range wireless communication signal, such as a Bluetooth™ signal having a higher strength than a GPS signal.

The lead-out transmission line portion 20B and the lead-out transmission line portion 21B are long in a direction perpendicular to the longitudinal direction of the flat cable 1, as illustrated in FIG. 5B. The flat cable 1, having such a shape, allows the connector 30A2 and the connector 30B2 to avoid the positions of chip devices 400 or the ICs 401.

Next, FIG. 6 is a bottom view of a flat cable 2 according to a second preferred embodiment of the present invention. The resist layers 101 and 102 are not illustrated in FIG. 6. Unlike the flat cable 1, the long conductor 122 of the auxiliary ground conductor 120 is divided into a long conductor 122A and a long conductor 122B in the flat cable 2. Description of common structures is omitted.

In other words, each of opening portions 126A is surrounded by the long conductor 122B, the long conductor 123, and the two bridge conductors 124. Each of opening portions 127A is surrounded by the long conductor 121, the long conductor 122A and the two bridge conductors 125.

As described above, the signal line 130 and the signal line 140 become unlikely to be coupled to each other through the auxiliary ground conductor 120 by electrically dividing the auxiliary ground conductor 120 into conductors respectively facing the signal line 130 and the signal line 140.

Figure 7:
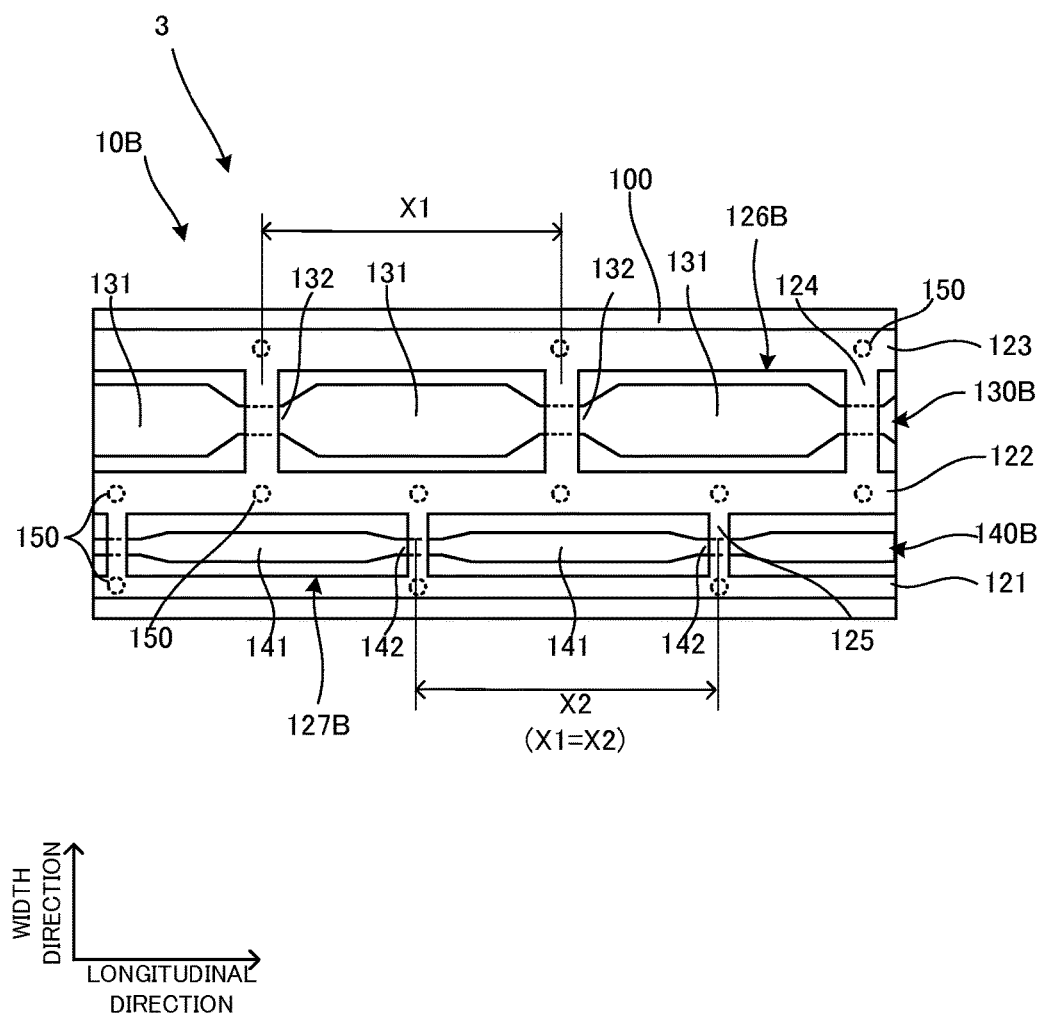
FIG. 7 is a bottom view of a flat cable according to a third preferred embodiment of the present invention.

Next, FIG. 7 is a bottom view of a flat cable 3 according to a third preferred embodiment of the present invention. The resist layers 101 and 102 are not illustrated in FIG. 7. Unlike the flat cable 1, the widths of a signal line 130B and a signal line 140B fluctuate between being wide and being narrow in the flat cable 3. Description of common structures is omitted.

The signal line 130B includes wide portions 131 and narrow portions 132 arranged alternately in the longitudinal direction. The signal line 130B gradually tapers from the wide portions 131 toward the narrow portions 132.

The signal line 140B includes wide portions 141 and narrow portions 142 arranged alternately in the longitudinal direction. The signal line 140B gradually tapers from the wide portions 141 toward the narrow portions 142.

The signal line 130B and the signal line 140B do not respectively cross the bridge conductors 124 and the bridge conductors 125 at the wide portions 131 and the wide portions 141. In other words, the signal line 130B and the signal line 140B become wide at respective positions where capacitive coupling is unlikely to increase. As a result, in the flat cable 3, the respective DC resistances of the signal line 130B and the signal line 140B is reduced while maintaining the characteristic impedances at desired values.

In addition, in the signal line 130B and the signal line 140B, since they gradually taper in the narrow portions 132 and the narrow portions 142, an increase in reflection loss is significantly reduced or prevented.

In the signal line 130B, capacitive coupling increases in portions in which the signal line 130B crosses the bridge conductors 124. However, the signal line 130B crosses the bridge conductors 124 in the narrow portions 132 as illustrated in FIG. 7 and, hence, an increase in the capacitive coupling is significantly reduced or prevented.

In the signal line 140B, capacitive coupling increases in portions in which the signal line 140B crosses the bridge conductors 125. However, the signal line 130B crosses the bridge conductors 125 in the narrow portions 142 as illustrated in FIG. 7 and, hence, an increase in the capacitive coupling is significantly reduced or prevented.

The flat cable 3 significantly reduces or prevents reduction in the characteristic impedance due to an increase in capacitive coupling with the auxiliary ground conductor 120 while significantly reducing or preventing an increase in reflection loss.

Referring to FIG. 7, the positions of the bridge conductors 124 are displaced from the positions of the bridge conductors 125 in the longitudinal direction. In other words, the center positions of the opening portions 126B are displaced from the center positions of the opening portions 127B in the longitudinal direction. Since the center positions of the opening portions 126B and the center positions of the opening portions 127B, which are positions at which the strengths of an electric field and a magnetic field become the highest, are displaced from one another, crosstalk is unlikely to be generated between the signal line 130B and the signal line 140B.

Note that an arrangement pitch X1 with which the bridge conductors 124 are arranged is preferably the same or substantially the same as an arrangement pitch X2 with which the bridge conductors 125 are arranged. However, these pitches need not be the same as long as the bridge conductors 124 are displaced from the bridge conductors 125.

Next, FIG. 8 is a bottom view of a flat cable 4 according to a fourth preferred embodiment of the present invention. The resist layers 101 and 102 are not illustrated in FIG. 8. Unlike the flat cable 3, in the flat cable 4, narrow portions 132C and narrow portions 142C are arranged in such a manner as to be displaced from the long conductor 122, and that the length of each bridge conductor 124C and the length of each bridge conductor 125C in the longitudinal direction are larger in portions connected to the long conductor 122. Description of common structures is omitted.

Referring to FIG. 8, the length of the bridge conductors 124C in the longitudinal direction does not change at positions superposed with narrow portions 132C, but gradually tapers outward toward the long conductor 122. The narrow portions 132C are arranged along the long conductor 123 side and spaced apart from the long conductor 122, as illustrated in FIG. 8. The connection portions of the bridge conductors 124C and the long conductor 122 are further spaced apart from the narrow portions 132C, due to the arrangement of the narrow portions 132C. As a result, even when the areas of the conductors are increased at the connection portions of the bridge conductors 124C and the long conductor 122 to arrange interlayer connection conductors 150C, the capacitive coupling between the narrow portions 132C and the bridge conductors 124C is unlikely to be increased since the connection portions exist at positions most unlikely to influence an increase in capacitive coupling.

Also in the case of the bridge conductors 125C, the areas of the conductors are increased at positions most unlikely to cause an increase in capacitive coupling, similarly to the bridge conductors 124C.

As a result, the connection portions of the long conductor 122 and the bridge conductors 124C or the bridge conductors 125C have enlarged areas and are able to be connected to the interlayer connection conductors 150C having larger diameters.

Note that a signal line 130C includes the wide portions 131 and the narrow portions 132C arranged alternately in the longitudinal direction. The signal line 130C gradually tapers from the wide portions 131 toward the narrow portions 132C. A signal line 140C includes the wide portions 141 and the narrow portions 142C. The signal line 140C gradually tapers from the wide portions 141 toward the narrow portions 142C. With this configuration, the flat cable 4 also achieves a similar effect to that of the flat cable 3.

Figure 9A:
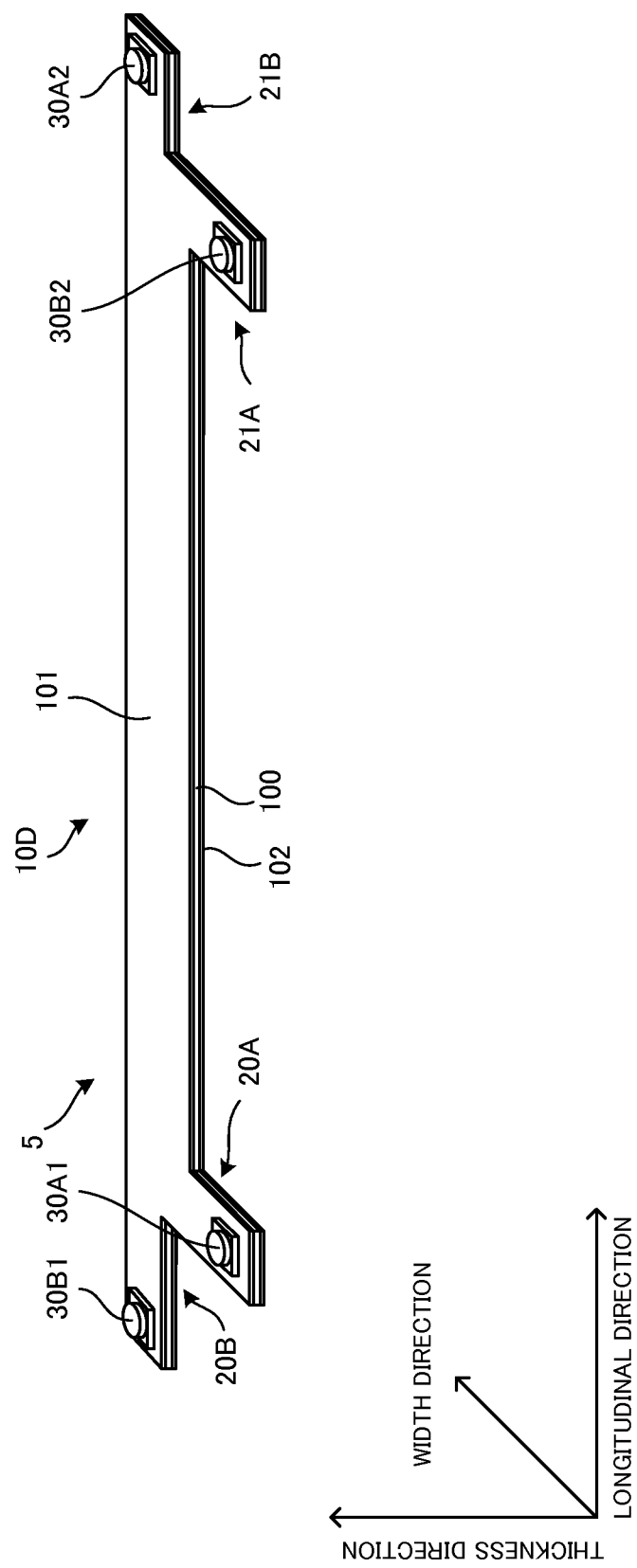
FIG. 9A and FIG. 9B are respectively an external perspective view and a bottom view of the flat cable according to a fifth preferred embodiment of the present invention.
Figure 9B:
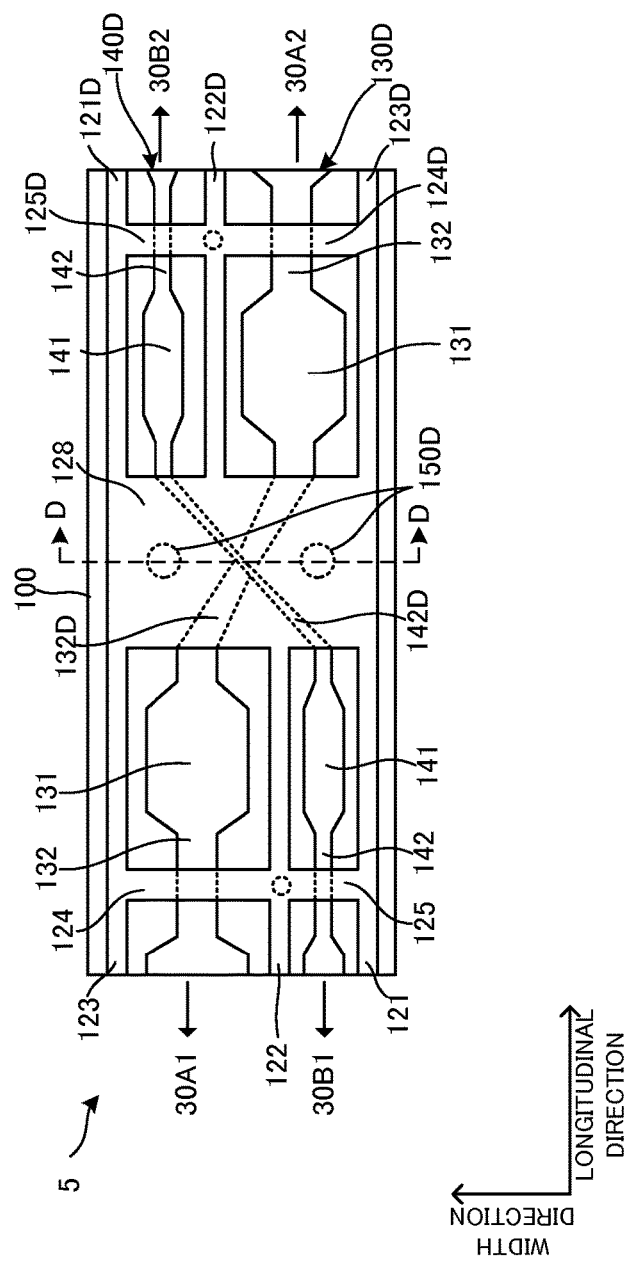
Figure 9C:
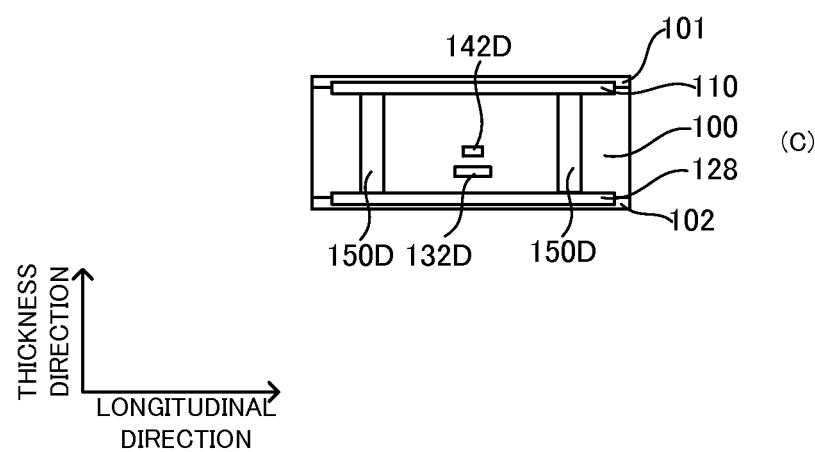
FIG. 9C is a cross-sectional view taken along line D-D.

Next, a flat cable 5 according to a fifth preferred embodiment of the present invention will be described. FIG. 9A is an external perspective view of the flat cable 5. FIG. 9B is a bottom view of the flat cable 5. FIG. 9C is a cross-sectional view taken along line D-D. The resist layers 101 and 102 are not illustrated in FIG. 9B.

The flat cable 5 is different from the flat cable 3 mainly in that a narrow portion 132D crosses a narrow portion 142D at a position facing a bridge conductor 128 in the flat cable 5. Description of common structures will be omitted.

Referring to FIG. 9A, the connector 30A2 is mounted on the lead-out transmission line portion 21B and the connector 30B2 is mounted on the lead-out transmission line portion 21A.

The narrow portion 132D and the narrow portion 142D cross each other at a position facing the bridge conductor 128. A long conductor 121D, a long conductor 122D, a long conductor 123D, a bridge conductor 124D, and a bridge conductor 125D are arranged along a signal line 130D and a signal line 140D which have crossed each other on the side of the connectors 30A2 and 30B2 in such a manner as to be inverted in the plane of FIG. 9B. With this shape, the flat cable 5 is able to be connected to the antenna circuit substrate 301 and the main circuit substrate 302 even when respective positions at which the GPS signal processing circuit 202 and the wireless LAN signal processing circuit 203 of the electronic apparatus 300 are arranged are swapped with each other.

Although the narrow portion 132D and the narrow portion 142D become close to each other in the portion where they cross each other, crosstalk is unlikely to be generated because they cross each other at a right angle or a substantially right angle.

The narrow portion 132D gradually tapers toward the center of the bridge conductor 128. The narrow portion 142D also gradually tapers toward the center of the bridge conductor 128. As a result, with this shape, an increase in the capacitive coupling of the narrow portion 132D and the narrow portion 142D with the bridge conductor 128 is significantly reduced or prevented.

Further, interlayer connection conductors 150D are arranged in the vicinity of the portion at which the narrow portion 132D and the narrow portions 142D cross each other. As a result, the strength of an electric field at this portion becomes low, whereby the narrow portion 132D and the narrow portion 142D become unlikely to be coupled with each other.

Figure 10B:
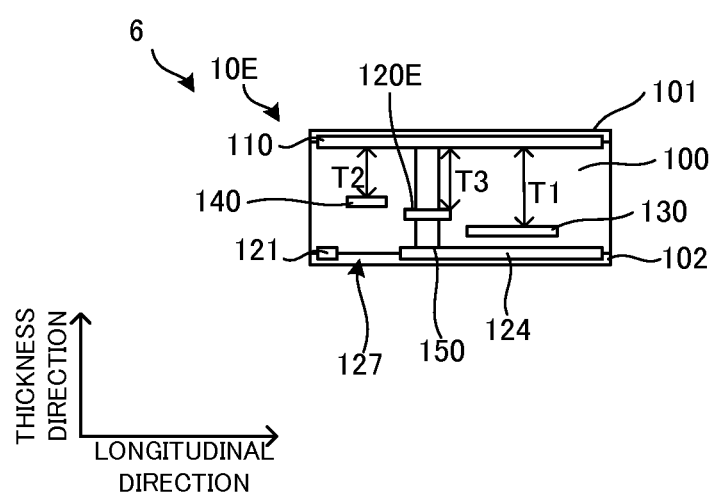
FIG. 10B is a cross-sectional view taken along line E-E.
Figure 10C:
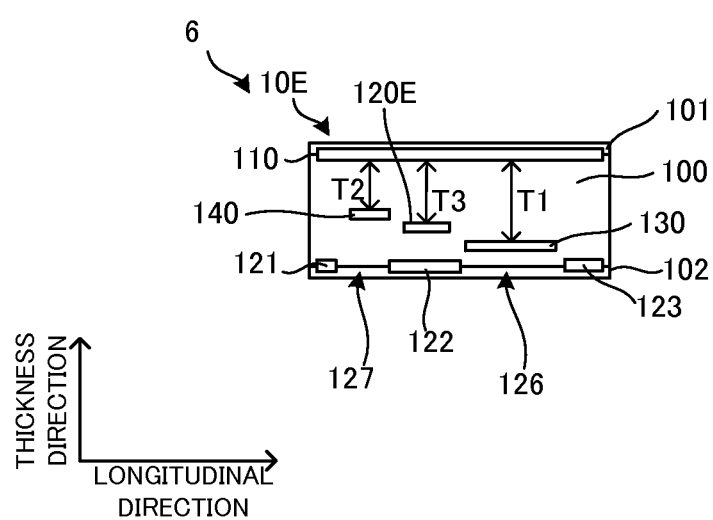
FIG. 10C is a cross-sectional view taken along line F-F.

Next a flat cable 6 according to a sixth preferred embodiment of the present invention will be described. FIG. 10A is a bottom view of a main transmission line portion 10E of the flat cable 6. FIG. 10B is a cross-sectional view taken along line E-E. FIG. 10C is a cross-sectional view taken along line F-F. In FIG. 10A, the resist layers 101 and 102 are not illustrated.

Unlike the flat cable 1, the flat cable 6 includes a second auxiliary ground conductor 120E between the signal line 130 and the signal line 140 inside the dielectric base body 100. Description of common structures is omitted.

The second auxiliary ground conductor 120E is substantially shaped like a flat layer which is long in the longitudinal direction, as illustrated in FIG. 10A and FIG. 10C. The second auxiliary ground conductor 120E is made of a conductive material (for example, a metal foil made of copper (Cu)).

The second auxiliary ground conductor 120E is arranged between the signal line 130 and the signal line 140 when the flat cable 6 is viewed in plan, as illustrated in the bottom view in FIG. 10A. In other words, the second auxiliary ground conductor 120E is not superposed with the signal line 130 and the signal line 140 when the flat cable 6 is viewed in plan. Referring to FIGS. 10B and 10C, the second auxiliary ground conductor 120E is spaced apart from the reference ground conductor 110 by a distance T3 in the thickness direction. The distance T3 is smaller than the distance T1 and larger than the distance T2. In other words, the second auxiliary ground conductor 120E is arranged between the signal line 130 and the signal line 140 in the thickness direction.

The plurality of interlayer connection conductors 150 are connected to the second auxiliary ground conductor 120E, as illustrated in FIG. 10A and FIG. 10B. As a result, the reference ground conductor 110, the auxiliary ground conductor 120, and the second auxiliary ground conductor 120E are connected to one another through the plurality of interlayer connection conductors 150.

As described above, in the flat cable 6, as a result of the second auxiliary ground conductor 120E being arranged between the signal line 130 and the signal line 140 when the flat cable 6 is viewed in plan, generation of crosstalk between the signal line 130 and the signal line 140 is significantly reduced or prevented. Further, as a result of the second auxiliary ground conductor 120E being located between the signal line 130 and the signal line 140 also in the thickness direction of the flat cable 6, generation of crosstalk between the signal line 130 and the signal line 140 is further significantly reduced or prevented.

Further, in the flat cable 6, since the second auxiliary ground conductor 120E is not superposed with the signal line 130 and the signal line 140 in plan view, an increase in the capacitive coupling between the second auxiliary ground conductor 120E and the signal lines 130 and 140 is significantly reduced or minimized such that the characteristic impedance is easily set to a desired value.

Figure 11A:
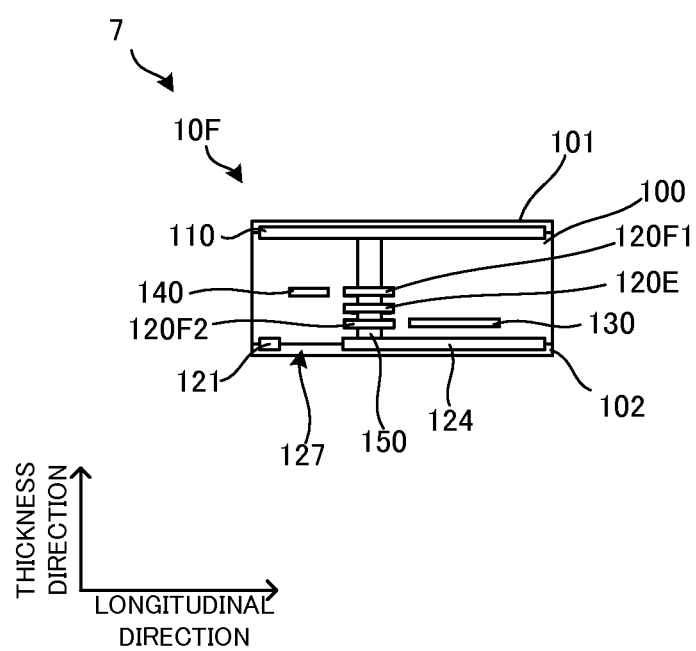

Next, a flat cable 7 according to a seventh preferred embodiment of the present invention will be described. FIG. 11A and FIG. 11B are cross-sectional views of a main transmission line portion 10F of the flat cable 7. The cross-sectional view in FIG. 11A corresponds to the cross-sectional view in FIG. 10B and the cross-sectional view in FIG. 11B corresponds to the cross-sectional view in FIG. 10C.

Unlike the flat cable 6, in the flat cable 7, a second auxiliary ground conductor 120F1 and a second auxiliary ground conductor 120F2 are arranged such that the second auxiliary ground conductor 120E is sandwiched therebetween in the thickness direction. In other words, the flat cable 7 includes the plurality of second auxiliary ground conductors 120E, 120F1, and 120F2 within the dielectric base body 100. Description of common structures is omitted.

The second auxiliary ground conductors 120F1 and 120F2 are substantially shaped like flat layers which are long in the longitudinal direction. The second auxiliary ground conductors 120F1 and 120F2 are made of a conductive material (for example, a metal foil made of copper (Cu)).

The second auxiliary ground conductors 120F1 and 120F2 are arranged between the signal line 130 and the signal line 140 when the flat cable 7 is viewed in plan. Referring to FIG. 11A and FIG. 11B, the second auxiliary ground conductor 120F1 is arranged at the same position in the thickness direction as the signal line 140. Referring to FIG. 11A and FIG. 11B, the second auxiliary ground conductor 120F2 is arranged at the same position in the thickness direction as the signal line 130. However, the second auxiliary ground conductor 120F1 (120F2) need not be arranged at the same position in the thickness direction as the signal line 140 (130) and need only be arranged such that the second auxiliary ground conductor 120E is sandwiched between the second auxiliary ground conductor 120F1 and the second auxiliary ground conductor 120F2.

Referring to FIG. 11A, the plurality of interlayer connection conductors 150 connect the second auxiliary ground conductor 120F2, the second auxiliary ground conductor 120E, and the second auxiliary ground conductor 120F1 to one another in this order in the thickness direction.

In the flat cable 7, since the second auxiliary ground conductors 120F1 and 120F2 are arranged near the second auxiliary ground conductor 120E, generation of crosstalk between the signal line 130 and the signal line 140 is further significantly reduced or prevented, compared with the flat cable 6.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency transmission line comprising:
   a multilayer base body including a plurality of base materials stacked on top of one another;
   a first ground conductor arranged on one main surface side of the multilayer base body;
   a second ground conductor arranged on another main surface side of the multilayer base body;
   a first signal line arranged within the multilayer base body and sandwiched between the first ground conductor and the second ground conductor, the first signal line being spaced apart from the first ground conductor by a first distance, the first signal line having a first line width; and
   a second signal line arranged within the multilayer base body and sandwiched between the first ground conductor and the second ground conductor, the second signal line being spaced apart from the first ground conductor by a second distance, the second signal line having a second line width; wherein the first line width is larger than the second line width;

the first distance is longer than the second distance;

the second ground conductor includes a plurality of first opening portions arranged along the first signal line and a plurality of second opening portions arranged along the second signal line;

the first ground conductor faces the first signal line and the second signal line along an entire length of the first ground conductor;

the first ground conductor includes an area that overlaps the first signal line and the second signal line;

no openings are included in the area of the first ground conductor that overlaps the first signal line and the second signal line; and a size of at least one of the plurality of the first opening portions is different from a size of at least one of the plurality of the second opening portions; a signal strength of a high-frequency signal that flows through the first signal line is lower than a signal strength of a high-frequency signal that flows through the second signal line; the first signal line is connected to an antenna for GPS communication; and the second signal line is connected to an antenna for a wireless local area network or for short-range wireless communication.

2. The high-frequency transmission line according to claim 1, wherein one of the first and second ground conductors is an auxiliary ground conductor including a plurality of elongated conductors and a plurality of bridge conductors defining a ladder configuration.

3. The high-frequency transmission line according to claim 2, wherein each of the first and second signal lines includes widened portions and narrowed portions in a width direction thereof.

4. The high-frequency transmission line according to claim 3, wherein the first and second signal lines respectively cross the bridge conductors at the narrowed portions.

5. The high-frequency transmission line according to claim 3, wherein the narrowed portions are displaced from one of the elongated conductors, and a length of each of the bridge conductors is larger in portions connected to the one of the elongated conductors than in other portions.

6. The high-frequency transmission line according to claim 3, wherein the narrowed portions gradually taper toward a center of one of the bridge conductors.

7. The high-frequency transmission line according to claim 2, wherein each of the first and second opening portions is surrounded by two of the elongated conductors and two of the bridge conductors.

8. The high-frequency transmission line according to claim 1, wherein the multilayer base body includes a first resist layer disposed on the first ground conductor, a dielectric base disposed between the first ground conductor and the second ground conductor, and a second resist layer on which the second ground conductor is provided.

9. The high-frequency transmission line according to claim 8, wherein the dielectric base includes the first signal line and the second signal line and a plurality of interlayer connection conductors.

10. The high-frequency transmission line according to claim 1, wherein a width of each of the plurality of first opening portions corresponding to the first signal line is larger than a width of each of the plurality of second opening portions corresponding to the second signal line.

11. The high-frequency transmission line according to claim 1, wherein the first ground conductor and the second ground conductor are electrically connected to each other through an interlayer connection conductor; and the interlayer connection conductor is located in a region sandwiched between the first signal line and the second signal line as seen from a plan view of the multilayer base body.

12. The high-frequency transmission line according to claim 1, wherein the plurality of base materials include flexible resin sheets.

13. The high-frequency transmission line according to claim 1, wherein the first signal line and the second signal line are respectively arranged closer to the second ground conductor than to the first ground conductor.

14. The high-frequency transmission line according to claim 1, wherein the multilayer base body includes resist layers on top and bottom layers thereof.

15. The high-frequency transmission line according to claim 1, wherein a length of each of the plurality of first opening portions corresponding to the first signal line is larger than a length of each of the plurality of second opening portions corresponding to the second signal line.

16. An electronic apparatus comprising the high-frequency transmission line according to claim 1.

17. The high-frequency transmission line according to claim 1, wherein the size of the at least one of the plurality of the first opening portions is larger than the size of the at least one of the plurality of the second opening portions.

* * * * *